United States Patent
Kenington

(12) 
(10) Patent No.: US 6,583,739 B1
(45) Date of Patent: Jun. 24, 2003

(54) FEED FORWARD DISTORTION REDUCTION SYSTEM

(75) Inventor: Peter Kenington, Devauden Green (GB)

(73) Assignee: Andrew Corporation, Orland Park, IL (US)

(*) Notice: Subject to any disclaimer, the term of this patent is extended or adjusted under 35 U.S.C. 154(b) by 0 days.

(21) Appl. No.: 10/048,300

(22) PCT Filed: Jun. 27, 2000

(86) PCT No.: PCT/GB00/02463

§ 371 (c)(1),
(2), (4) Date: Jan. 24, 2002

(87) PCT Pub. No.: WO01/08293

PCT Pub. Date: Feb. 1, 2001

(30) Foreign Application Priority Data

Jul. 28, 1999 (GB) .............................................. 9917746

(51) Int. Cl.[7] .............................................. H03M 1/06
(52) U.S. Cl. ...................................... 341/118; 330/149
(58) Field of Search ................................ 341/118, 119, 341/117, 120; 330/149, 136, 151

(56) References Cited

U.S. PATENT DOCUMENTS 5,877,653 A   3/1999   Kim
5,892,397 A   4/1999   Bagwell et al.

FOREIGN PATENT DOCUMENTS

| WO | WO98/12800 | 3/1998 |
| WO | WO99/22444 | 5/1999 |
| WO | WO99/23756 | 5/1999 |
| WO | WO99/45639 | 9/1999 |

Primary Examiner—Jean Bruner Jeanglaude
(74) Attorney, Agent, or Firm—Steve Mendelsohn

(57) ABSTRACT

The lineariser (1) comprises a digital signal processor (DSP) (100) for reducing distortion of the output of non-linear RF power amplifier (200). The DSP (100) implements a predistorter process (102) which predistorts the input to amplifier (200) in such a manner as to counter distortion imposed by the amplifier. Feedback from the amplifier output is sampled at (212) to provide a feedback signal for controlling the predistortion process. Additionally, a feedforward signal is combined with the amplifier output at (216) to further reduce distortion therein. The feedforward signal is derived by subtracting the input signal, at (112), from feedback from the output of amplifier (200) (which may contain residual distortion). The vector modulator (114) conditions the result of the subtraction process (112) to produce the feedforward signal. To ensure maximum cancellation of distortion in the output of amplifier (200), the vector modulator is adapted using feedback from the output of amplifier (200) (removed at 218) which is correlated with a reference signal produced by distorter (102). The reference signal contains components which correspond to some or all of the intermodulations distortion components which can be generated by amplifier (200).

30 Claims, 5 Drawing Sheets

FEED FORWARD DISTORTION REDUCTION SYSTEM

FIELD OF THE INVENTION

This invention relates to an arrangement and a method for reducing distortion of an output signal provided by signal handling means in response to an input signal.

BACKGROUND OF THE INVENTION

Current and forthcoming telecommunications standards place an increasingly stringent requirement on the linearity of transceiver circuits, particularly given the proposed wide channel band-widths of handset transceivers compared to, for example, DAMPS, and PDC systems. In order to realise a power efficient transceiver design, some form of linearisation is therefore required. The linearisation arrangement itself should be low power, capable of broad band linearisation (up to 5 MHz for UMTS/UTRA), frequency flexible, preferably multiband, and capable of achieving and maintaining high levels of linearity improvement when used to reduce distortion caused by highly non-linear power amplifiers (eg class C amplifiers), such as may be used in transceiver circuits.

The trend in base station technology is towards adoption of "software radio" techniques, that is, base station architectures in which all of the modulation parameters, ramping, framing, etc. take place for all channels at base band in the digital domain. The combination of all channels, at appropriate frequency offsets from one another, can also be performed at base band and the whole channel spectrum up-converted to the transmission frequency in a single block for multi-carrier power amplification and transmission from a single antenna.

SUMMARY OF THE INVENTION

According to one aspect, the invention provides an arrangement for reducing distortion of an output signal provided by signal handling means in response to an input signal, the arrangement comprising feedforward means which derives a feedforward signal from the input signal and combines it with the output signal to reduce distortion thereof, and predistorting means which predistorts the input signal prior to the signal handling means to counter distortion caused by the signal handling means, wherein the predistorting means also derives a reference signal from the input signal for use in controlling the feedforward signal. An arrangement of this type can handle digital base band signals (such as may be provided by a software radio) and perform the necessary frequency conversion and amplification, with reduced distortion, to provide an output signal for transmission from an antenna. Further, this arrangement allows the benefits of input signal predistortion and feedforward correction of the output signal to be realised independently, thus combining the distortion reduction effects of each without any degradation of either.

Advantageously, the reference signal may contain components which correspond to some or all of the intermodulation distortion components which can be produced by the signal handling means. Preferably, the reference signal is generated in the digital domain. The reference signal may be created to an arbitrarily high degree of accuracy, which leads to improved control of the feedforward signal.

In a preferred embodiment, the arrangement additionally comprises control means for adapting the feedforward signal using feedback derived from the output signal. Preferably, this feedback is extracted from the output signal after its combination with the feedforward signal. The feedback may be correlated with the reference signal provided by the predistorting means to produce a control signal for the feedforward means.

In a preferred embodiment, the arrangement also comprises means for adapting the predistortion applied by the predistorting means using feedback derived from the output signal.

Advantageously, the feedforward signal is produced by performing a subtraction on the input signal and a feedback signal derived from the output signal. Preferably, this feedback signal is taken from the output signal before its combination with the feedforward signal. The subtraction process preferably uses the input signal prior to its predistortion. The subtraction may be performed in the digital domain, or, alternatively, in the analogue domain.

According to another aspect, the invention provides a method for reducing distortion of an output signal provided by signal handling means in response to an input signal, the method comprising a feed forward step of deriving a feed forward signal from the input signal and combining it with the output signal to reduce distortion thereof, a predistorting step comprising predistorting, using predistorting means, the input signal prior to the signal handling means to counter distortion caused by the signal handling means, and a generating step of generating a reference signal from the input signal using the predistorting means for use in controlling the feed forward signal.

BRIEF DESCRIPTION OF THE DRAWINGS

By way of example only, some embodiments of the invention will now be described with reference to the accompanying drawings; in which.

DETAILED DESCRIPTION OF THE INVENTION

Figure 1:
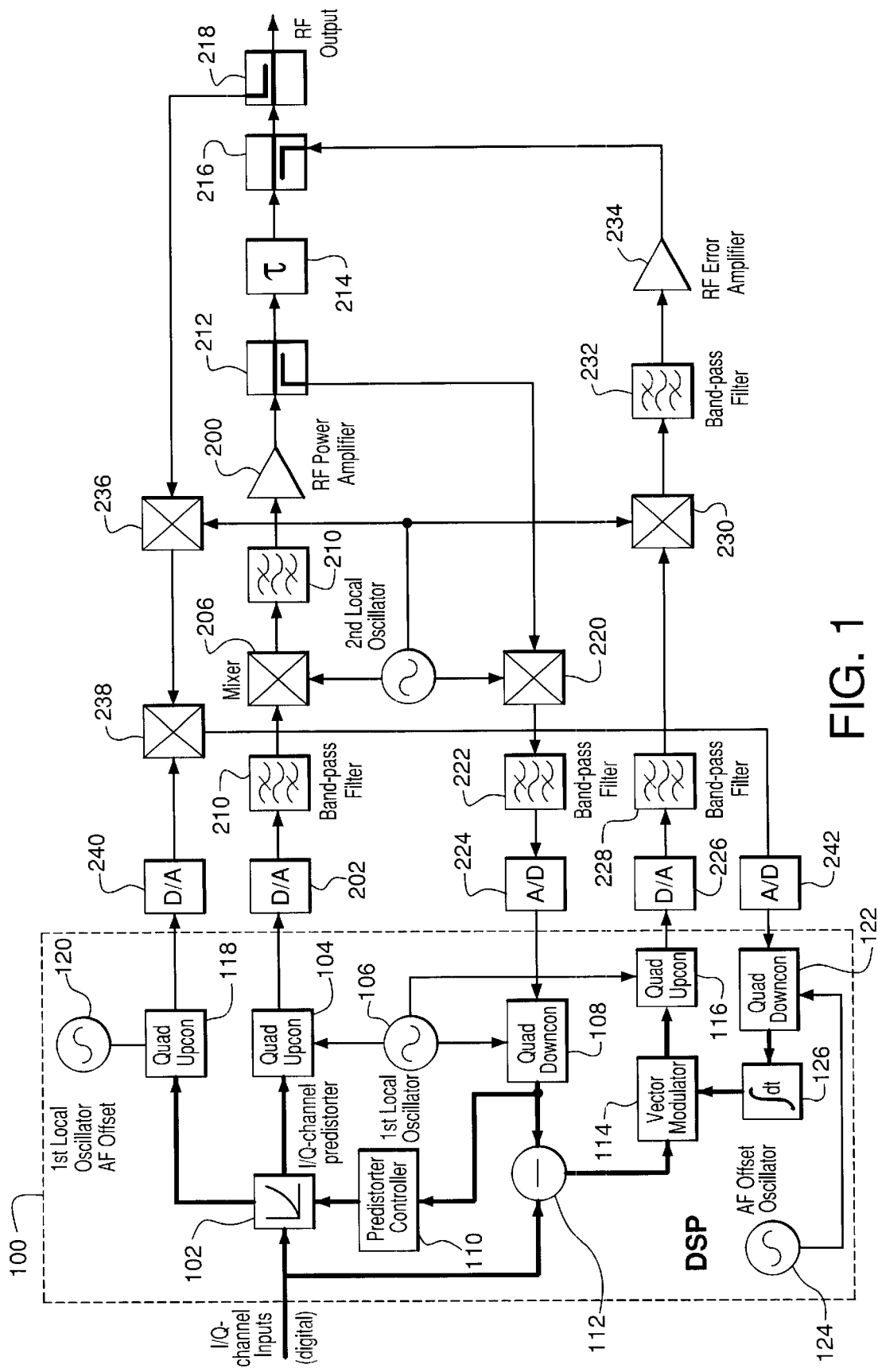
FIG. 1 is a block diagram illustrating a lineariser operating on a non-linear RF power amplifier.

With reference to FIG. 1, the lineariser, generally indicated 1, comprises a digital signal processor (DSP) 100 which controls the manipulation of the input signal to, and the output signal from, radio frequency (RF) power amplifier 200 so as to linearise, i.e reduce distortion of, the output of the amplifier 200.

The input signal to the DSP 100 is provided by a software radio system and comprises a digital, base band, quadrature-format signal comprising in phase (I) and quadrature (Q) channel signals. In the Figures, quadrature-format signals are indicated by heavy black arrows. Within the DSP 100, the quadrature-format input signal is provided to predistorter 102 which provides a predistorter version of the input signal to quadrature upconverter 104. Upconverter 104 mixes the input signal with a signal having a first frequency from a first local oscillator 106 to produce a predistorted input signal which has been upconverted to the intermediate frequency (IF) band. This signal is converted into an analogue signal at 202 and band pass filtered at 204. The output of filter 204 is supplied to mixer 206 for up conversion to the RF band. At mixer 206, the filter output is mixed with a signal having a second frequency from the local oscillator 208 to produce the RF predistorted input signal. This signal is band pass filtered at 210 prior to being supplied to amplifier 200. The predistortion applied to the input signal helps to counter distortion introduced by the non-linear amplifier 200. A portion of the amplifier output is removed at coupler 212 and is fed back to the DSP 100 for control purposes as will be described later.

The main portion of the output of amplifier 200 continues through coupler 212 and delay element 214 (the function of which will be described later) to coupler 216. At coupler 216, a feedforward signal is combined with the output of amplifier 200 in order to further reduce the distortion caused by the amplifier. The twice linearised output of amplifier 200 is supplied from coupler 216 as an RF output for transmission from an antenna. Coupler 218 removes a portion of this RF output signal to provide a feedback signal for controlling the linerisation process, as will be described later.

The predistorter 102 distorts the input signal in such a way as to counter distortion which will be caused by the non-linear amplifier 200. The predistorter 102 may be of any appropriate type. For example, it may comprise a polynominal predistorter which functions by creating a distortion which is added into the input signal to predistort it. The distortion signal itself is generated from the input signal and comprises various harmonics of the input signal, generated by mixing the input signal with itself the requisite number of times. Alternatively, for example, the predistorter could be a lookup table based predistorter which retrieves coefficients from a lookup table which correspond to amplitude and frequency values of the input signal. The retrieved coefficients are multiplied with, typically, amplitude values of frequency components of the input signal in order to generate a predistorted input signal.

The control aspects relating to the predistortion process will now be described. The portion of the output of amplifier 200 which is fed by coupler 212 is down converted at mixer 220 by mixing it with the signal having the second frequency from local oscillator 208. The output of mixer 220 is band pass filtered at 222 and the resulting IF band signal is converted to a digital signal by analogue to digital converter (ADC) 224 and supplied to DSP 100. This digital IF band feedback signal is down converted to base band at quadrature down converter 108. The quadrature format base band feedback signal is then supplied to predistorter controller 110 which adapts the characteristics of the predistortion applied to the input signal by predistorter 102 in order to minimise residual distortion appearing in the signal fed back from coupler 212.

As mentioned above, distortion appearing in the output of amplifier 200 is also countered by a feedforward signal introduced at coupler 216. The process by which the feedforward signal is produced and controlled will now be described. The quadrature format input signal provided to DSP 100 is supplied to a subtractor 112. Subtractor 112 also receives from downconverter 108 the sampled output of amplifier 200 containing residual distortion. Subtractor 112 subtracts the input signal from the feedback signal to produce a residual distortion signal. This signal is received by vector modulator 114 which applies appropriate delay and weighting of gain and phase. The vector modulator 114 conditions the residual distortion signal, creating a feedforward signal which is added at coupler 216 to further reduce (cancel) distortion in the output of amplifier 200. The feedforward signal produced by vector modulator 114 is quadrature upconverted at 116 using the signal of the first frequency from local oscillator 106 to provide an IF band signal which is then converted to the analogue domain by DAC 226. The IF feedforward signal is passed by band pass filter 228 to mixer 230 where it is upconverted to the RF band by mixing with the signal having the second frequency from local oscillator 208. The output of mixer 230 is band pass filtered at 232, and the resulting RF band feedforward signal is subjected to appropriate amplification at 234 to provide the feedforward signal for cancelling distortion in the output of amplifier 200. Delay element 214 is provided prior to coupler 216 to ensure that the signal issued by amplifier 200 is synchronised with the feedforward signal.

In order to adapt the feedforward signal to the varying nature of the distortion in the output of amplifier 200, coupler 218 removes a portion of the twice linearised amplifier output for use in feedback control of the conditioning applied to the residual distortion signal by vector modulator 114. The feedback from coupler 218 is frequency downconverted at mixer 236 by mixing it with the signal having the second frequency from local oscillator 208. The IF output of mixer 236 is then mixed, at 238, with a reference signal from DSP 100 as part of a correlation process. The reference signal generated within DSP 100 is provided by the predistorter 102.

Using the input signal, the predistorter 102 creates a reference signal containing only components corresponding to intermodulation distortion signals which could be created by amplifier 200, and containing substantially no main signal (i.e original input signal) energy. Since the reference signal is being created digitally, it may be created to an arbitrarily high degree of accuracy, which leads to refined results from the correlation process involving mixer 238 (which will be described in more detail shortly). The reference signal produced by predistorter 102 is quadrature upconverted to the IF band at 118 by mixing it with a signal from local oscillator 120. The signal provided by local oscillator 120 has a frequency which is displaced from the first frequency, i.e the frequency of the signal provided by local oscillator 106, by an audio frequency (AF) amount. The IF band reference signal is converted to the analogue domain by DAC 240 and supplied to an input of mixer 238.

The output of mixer 238 is converted to the digital domain by ADC 242 and supplied to quadrature down converting process 122 in DSP 100. At quadrature down converter 122, the output of ADC 242 is mixed with a signal from local oscillator 124. The signal provided by this local oscillator has a frequency equal to the audio frequency offset of oscillator 120. The output signals produced by quadrature down converter 122 are integrated at 126 to provide dc control signals for the conditioning applied by vector modulator 114. The integrator 126 provides non-zero signals corresponding to any base band input it receives. The integrator 126 receives base band input if there is any residual distortion in the feedback from 218 which corresponds in frequency (once frequency conversion processes 118, 236 and 122 have been taken into account) to (components of) the reference signal provided by predistorter 102.

Figure 2A:
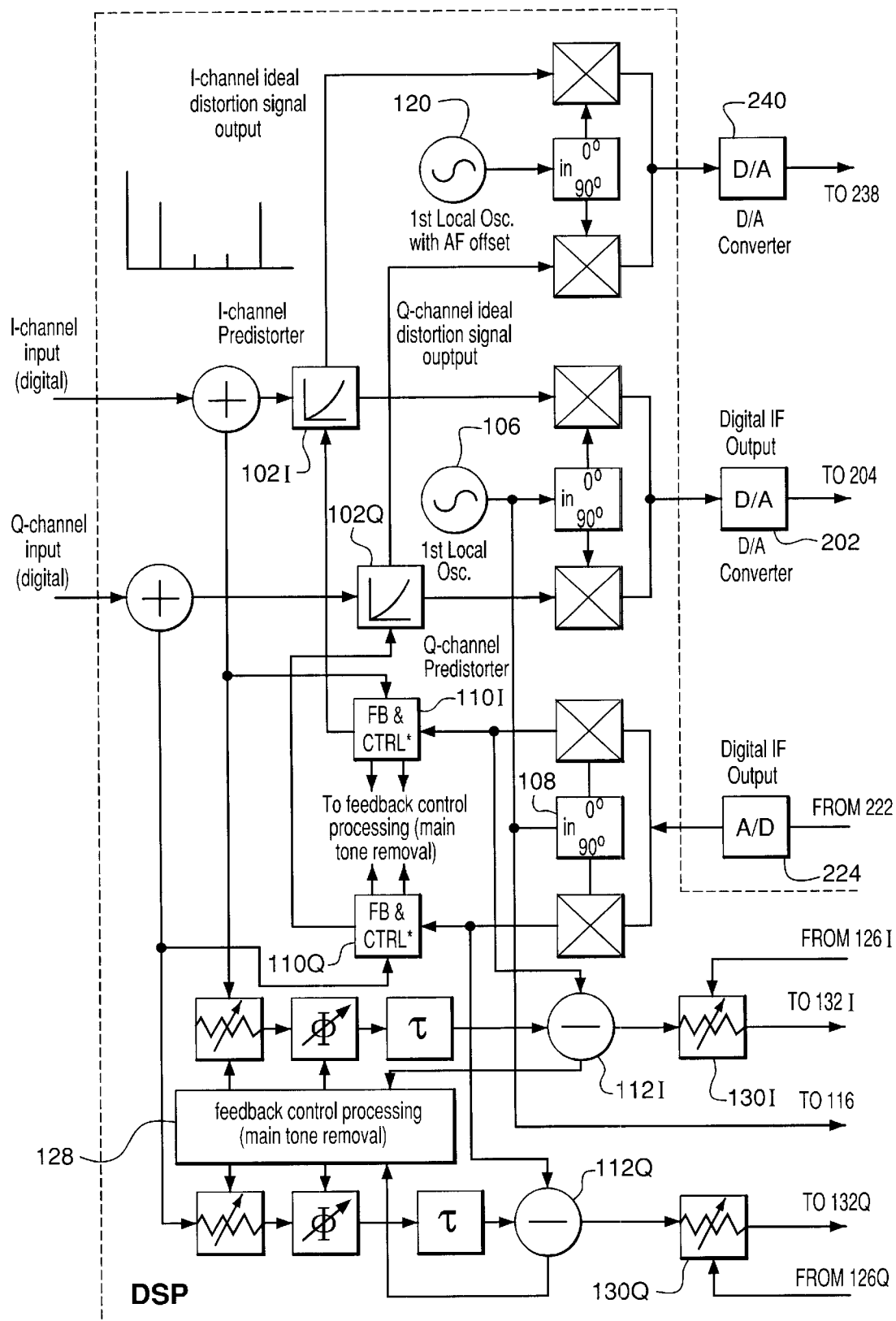
FIGS. 2a and 2b are block diagrams illustrating the lineariser of FIG. 1 in more detail.
Figure 2B:
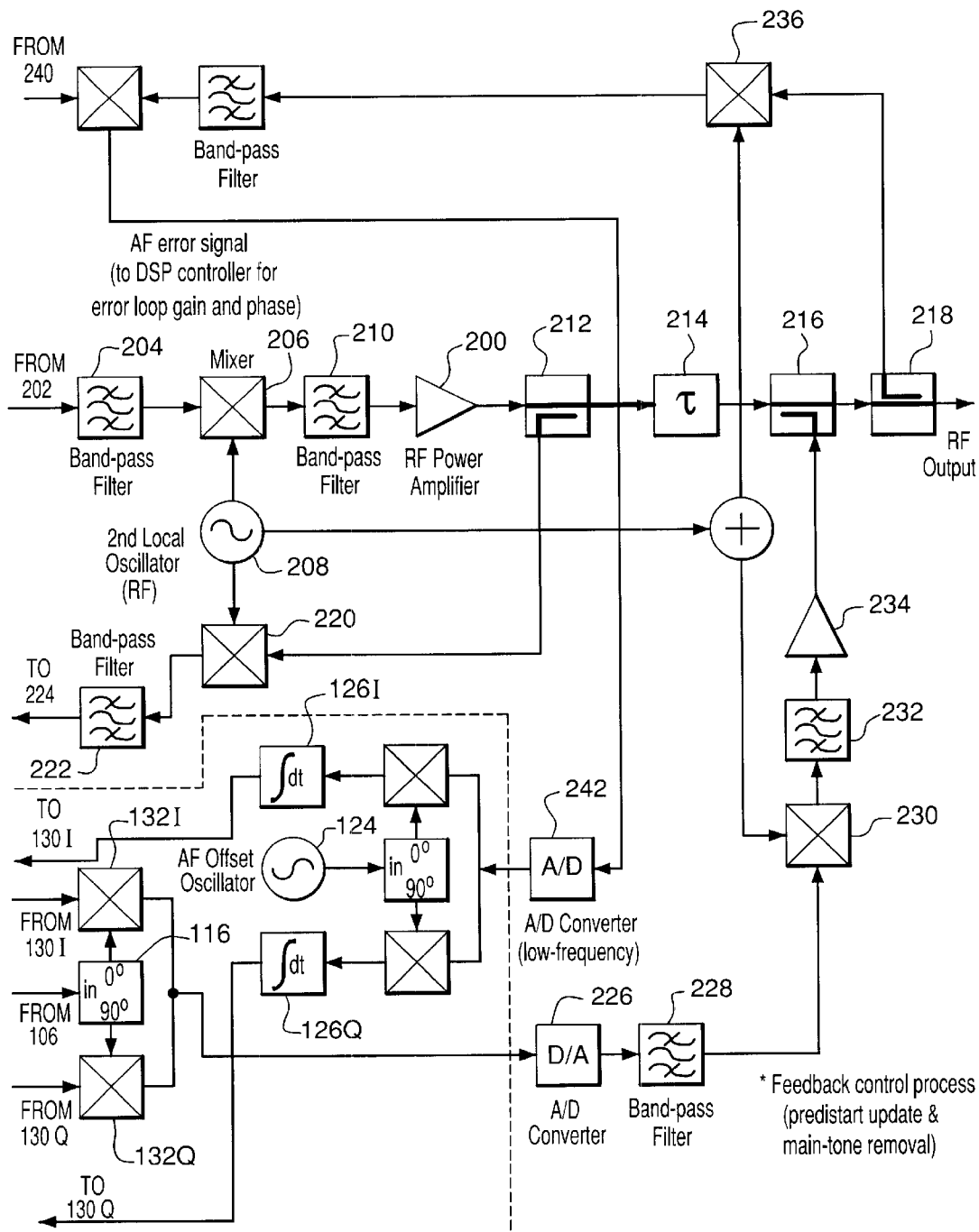

FIG. 2, which is divided into FIGS. 2a and 2b, illustrates the lineariser of FIG. 1 in more detail. For example, the I and Q quadrature signals comprising the input signal to the DSP 100 are shown individually. The predistorter 102 of FIG. 1 comprises two independent distorters 102 I and 102 Q, each operating on a respective one of the I and Q channel input signals. The predistorters 102 I and Q are controlled by independent feedback and control mechanisms 110 I and 110

Q, respectively, which receive respective I and Q feedback signals derived from the feedback signal from coupler 212 by quadrature down converter 108.

In the feedforward mechanism, the I and Q input signals are independently delayed and adjusted for amplitude and phase under the control of feedback control process 128. The adjusted I and Q input signals so produced are then handled in parallel, and are subjected to the same processes, and hence the processing of the I channel adjusted input signal only will now be described. The adjusted I channel input signal is subtracted at 112 I from the I channel component of the feedback from 212 in order to produce an I channel residual distortion signal. This signal is amplitude adjusted by available gain element 130 I, which is under the control of a signal from integrator 126 I (corresponding to integrator 126 of the FIG. 1). The Q channel adjusted input signal is processed in a similar manner by elements 112 Q, 130 Q and 126 Q. Variable gain elements 130 I and Q constitute a vector modulator. The I and Q outputs of the vector modulator are combined by quadrature upconverter 116 using mixers 132 I and Q.

Whilst the positioning of subtraction process 112 within the DSP 100 in the embodiment of FIGS. 1 and 2 permits ideal subtraction to be performed, it does introduce the potential for a delay being introduced in the subsequent digital processing and DAC. This delay must be matched by a delay in the main path (214 following amplifier 200), and the resulting delay at the amplifier output may be significant in terms of size and loss, depending on the application involved.

To avoid such a delay, the subtraction process can be performed in a higher frequency band, either at IF (digitally or, preferably, in the analogue domain) or at RF. The latter arrangement is shown in FIG. 3.

Figure 3:
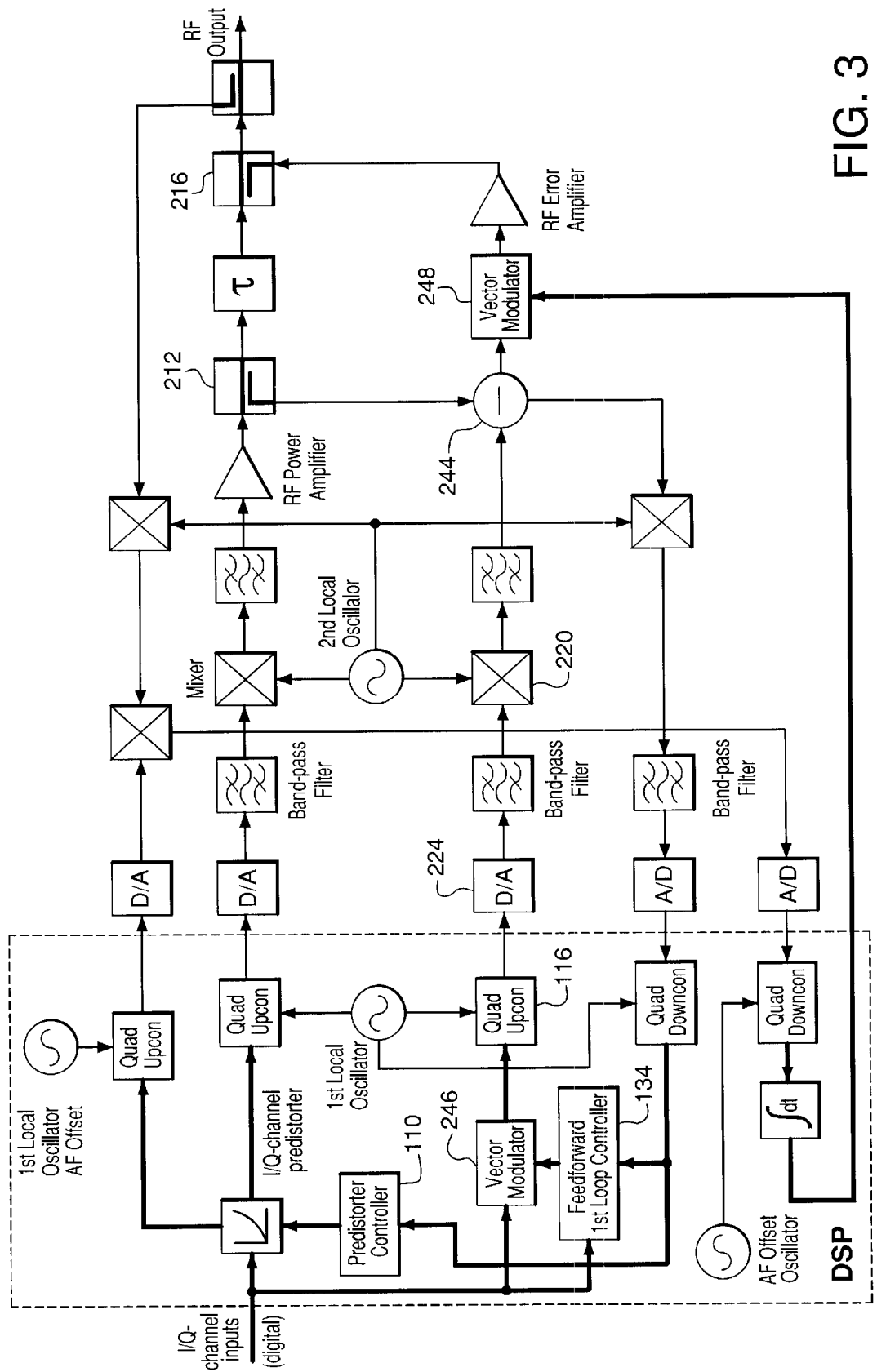
FIG. 3 is a block diagram of a lineariser operating on a non-linear RF power amplifier.

In FIG. 3, the subtraction process 244 has been removed from the DSP 100 and now operates on RF band signals. Two vector modulators 246 and 248 are shown in FIG. 3. Together, these correspond to vector modulator 114 of FIG. 1. Vector modulator 246 conditions the quadrature input signal in the same way as the delay, gain and phase adaptation process is controlled by process 128 in FIG. 2a. The conditioned input signal produced by vector modulator 246 is upconverted to the IF band and then to the RF band, and is then supplied to process 244 where it is subtracted from the feedback signal from coupler 212. The output of process 244 is a signal containing residual distortion components, and this is conditioned by vector modulator 248, which corresponds to vector modulator elements 130 I and Q of FIG. 2a. The output of vector modulator 248 is the feedforward signal which is introduced to the output of amplifier 200 at coupler 216. It is also to be noted that the feedback signal from coupler 212 is no longer used in merely down converted form as a feedback signal for distorter controller 110. Instead, the residual distortion signal produced by subtraction process 244 is down converted to base band and supplied to the predistortion controller 110 and feedforward loop controller 134. The feedforward loop controller 134 corresponds to feedback and control processes 110 I and Q of FIG. 2a.

As mentioned above, the subtraction process 244 could be implemented at other points in the system. For example, the subtraction process could be implemented after upconversion to the IF band 116 or after DAC 224.

Figure 4:
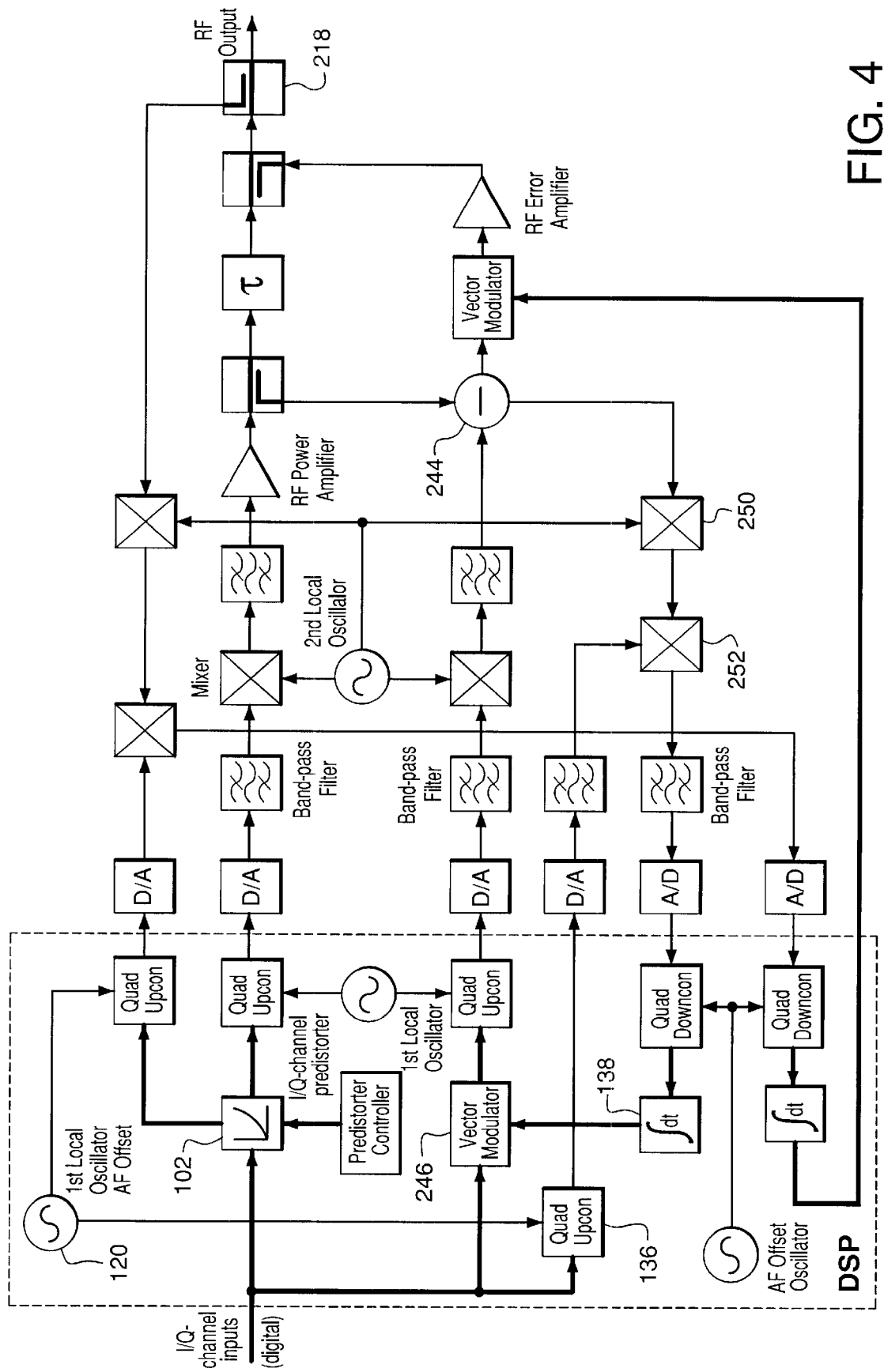
FIG. 4 is a block diagram of a lineariser operating on a non-linear RF power amplifier.

A further embodiment, shown in FIG. 4, uses an AF offset frequency based technique to control the generation of the control signals for vector modulator 246. This embodiment is especially useful if fixed predistortion is to be applied, as it entirely removes the need for wide band ADC. The predistorter 102 is nevertheless still capable of providing the reference signal for ideal correlation with the feedback from coupler 218. Returning to the control of the vector modulator 246, the residual distortion signal output by subtraction process 244 is down converted at mixer 250 to the IF band. Mixer 252 then correlates the IF band residual distortion signal from mixer 250 with an IF band version of the input signal produced by quadrature upconversion process 136 using AF offset oscillator 120. The output of mixer 252 is down converted to base band in the DSP 100 and integrated at 138 to provide control signals for vector modulator 246. If one considers the frequencies employed by the various local oscillators, it will be apparent that integrator 138 produces non-zero output when it receives DC input indicative of residual distortion in the output of subtraction process 244 matching the frequency or frequencies of the system input signals.

What is claimed is:

1. An arrangement for reducing distortion of an output signal provided by signal handling equipment in response to an input signal, the arrangement comprising a feed forward corrector which derives a feed forward signal from the input signal and combines it with the output signal to reduce distortion thereof, and a predistorter which predistorts the input signal prior to the signal handling equipment to counter distortion caused thereby, wherein the predistorter also derives a reference signal from the input signal for use in controlling the feed forward signal.

2. An arrangement according to claim 1, wherein the reference signal comprises components which correspond to intermodulation distortion components which could be introduced by the signal handling equipment.

3. An arrangement according to claim 1, wherein the reference signal is created in the digital domain.

4. An arrangement according to claim 1, further comprising a first controller for adapting feed forward signal using a first feedback signal derived from the output signal.

5. An arrangement according to claim 4, wherein the first feedback signal is derived from the output signal after its combination with the feed forward signal.

6. An arrangement according to claim 4, wherein the first controller correlates the reference signal with the first feedback signal.

7. An arrangement according to claim 6, wherein the correlation process comprises mixing the reference signal with the first feedback signal and integrating the result to produce a control signal for the feed forward corrector.

8. An arrangement according to claim 1, further comprising a second controller for adapting the predistortion applied by the predistorter using a second feedback signal derived from the output signal.

9. An arrangement according to claim 1, wherein the predistorter predistorts the input signal by using a polynomial distortion generation process to produce a distortion signal for combination with the input signal.

10. An arrangement according to claim 1, wherein the predistorter predistorts the input signal by using coefficients from a lookup table to process the input signal to produce a predistorted input signal.

11. An arrangement according to claim 1, wherein the signal handling equipment comprises an amplifier.

12. An arrangement according to claim 1, wherein:
a predistorted input signal from the predistorter is upconverted to an intermediate frequency (IF) based on a first oscillator frequency prior to being applied to the signal handling equipment;

the reference signal from the predistorter is upconverted based on a second oscillator frequency offset from the first oscillator frequency by an audio frequency (AF) offset;

the upconverted reference signal is mixed with a feed back signal derived from the output signal generated by the signal handling equipment to generate a mixed feed back signal; and the mixed feed back signal is used to control generation of the feed forward signal.

13. An arrangement according to claim 12, wherein:

the mixed feed back signal is downconverted based on the AF offset frequency; and the downconverted mixed feed back signal is integrated to generate a control signal used to control operations of a vector modulator used in generating the feed forward signal.

14. An arrangement according to claim 1, wherein the predistorter generates at least two signals: the reference signal and a predistorted input signal that is applied to the signal handling equipment.

15. A method for reducing distortion of an output signal provided by signal handling equipment in response to an input signal, the method comprising a feed forward step of deriving a feed forward signal from the input signal and combining it with the output signal to reduce distortion thereof, a predistorting step comprising predistorting, using a predistorter, the input signal prior to the signal handling equipment to counter distortion caused by the signal handling equipment, and a generating step of generating a reference signal from the input signal using the predistorter for use in controlling the feed forward signal.

16. A method according to claim 15, wherein the reference signal comprises components which correspond to intermodulation distortion components which could be generated by the signal handling equipment.

17. A method according to claim 15, wherein the reference signal is created in the digital domain.

18. A method according to claim 15, further comprising a first control step of adapting the feed forward signal using a first feed back signal derived from the output signal.

19. A method according to claim 18, wherein the first feed back signal is derived from the output signal after its combination with the feed forward signal.

20. A method according to claim 18, wherein the first control step comprises correlating the reference signal with the first feed back signal.

21. A method according to claim 20, wherein the correlation process comprises mixing or multiplying the reference signal with the first feed back signal and integrating the result to produce a control signal.

22. A method according to claim 15, wherein the feed forward signal is produced by performing a subtraction on the input signal and a second feed back signal derived from the output signal.

23. A method according to claim 22, wherein the second feed back signal is derived from the output signal prior to its combination with the feed forward signal.

24. A method according to claim 22, wherein the subtraction uses the input signal prior to its predistortion.

25. A method according to claim 22, wherein the predistorting step comprises generating a distortion signal by distorting the input signal using a polynominal distortion generation process and combining the distortion signal with the input signal.

26. A method according to claim 22, wherein the predistorting step comprises generating a distortion signal by distorting the input signal using coefficients retrieved from a lookup table to produce the predistorted input signal.

27. A method according to claim 22, wherein the signal handling equipment is an amplifier.

28. A method according to claim 15, wherein:

a predistorted input signal from the predistorter is upconverted to an intermediate frequency (IF) based on a first oscillator frequency prior to being applied to the signal handling equipment;

the reference signal from the predistorter is upconverted based on a second oscillator frequency offset from the first oscillator frequency by an audio frequency (AF) offset;

the upconverted reference signal is mixed with a feed back signal derived from the output signal generated by the signal handling equipment to generate a mixed feed back signal; and the mixed feed back signal is used to control generation of the feed forward signal.

29. A method according to claim 28, wherein:

the mixed feed back signal is downconverted based on the AF offset frequency; and the downconverted mixed feed back signal is integrated to generate a control signal used to control operations of a vector modulator used in generating the feed forward signal.

30. A method according to claim 15, wherein the predistorter generates at least two signals: the reference signal and a predistorted input signal that is applied to the signal handling equipment.

* * * * *